(12) United States Patent
Amir

(10) Patent No.: US 10,698,321 B2
(45) Date of Patent: Jun. 30, 2020

(54) PROCESS COMPATIBLE SEGMENTED TARGETS AND DESIGN METHODS

(71) Applicant: KLA-Tencor Corporation, Milpitas, CA (US)

(72) Inventor: Nuriel Amir, St. Yokneam (IL)

(73) Assignee: KLA-Tencor Corporation, Milpitas, CA (US)

( * ) Notice: Subject to any disclaimer, the term of this patent is extended or adjusted under 35 U.S.C. 154(b) by 196 days.

(21) Appl. No.: 14/234,540

(22) PCT Filed: Nov. 21, 2013

(86) PCT No.: PCT/US2013/071156
§ 371 (c)(1),
(2) Date: Jan. 23, 2014

(87) PCT Pub. No.: WO2014/081913
PCT Pub. Date: May 30, 2014

(65) Prior Publication Data
US 2014/0307256 A1 Oct. 16, 2014

Related U.S. Application Data

(60) Provisional application No. 61/729,282, filed on Nov. 21, 2012.

(51) Int. Cl.
*G03F 7/20* (2006.01)
*G01B 11/14* (2006.01)
*G01B 11/02* (2006.01)

(52) U.S. Cl.
CPC .......... *G03F 7/70616* (2013.01); *G01B 11/02* (2013.01); *G01B 11/14* (2013.01); *G03F 7/70625* (2013.01); *G03F 7/70633* (2013.01)

(58) Field of Classification Search
CPC ...... G01B 21/02; G01B 21/04; G01B 21/042; G01B 21/047; G01B 11/00; G01B 11/02;
(Continued)

(56) References Cited

U.S. PATENT DOCUMENTS

| 5,731,877 A | 3/1998 | Ausschnitt |
| 6,072,889 A | 6/2000 | Deaett et al. |

(Continued)

FOREIGN PATENT DOCUMENTS

| JP | 2006515958 | 6/2006 |
| JP | 2012033923 A | 2/2012 |
| WO | 2002065545 A2 | 8/2008 |

OTHER PUBLICATIONS

Office Action dated Dec. 24, 2019 for Korean Application No. 10-2015-7016514.

*Primary Examiner* — Gordon J Stock, Jr.
(74) *Attorney, Agent, or Firm* — Suiter Swantz pc llo

(57) ABSTRACT

Methods of designing metrology targets are provided, which comprise distinguishing target elements from their background area by segmenting the background area and optionally segmenting the target elements. The provided metrology targets may maintain a required feature size when measured yet be finely segmented to achieve process and design rules compatibility which results in higher accuracy of the metrology measurements. Particularly, all transitions between target features and adjacent background features may be designed to maintain a feature size of the features below a certain threshold.

15 Claims, 5 Drawing Sheets

(58) Field of Classification Search
CPC ... G01B 11/022; G01B 11/024; G01B 11/028; G01B 11/03; G01B 11/14; G01B 11/24; G06F 17/50; G03F 7/70483; G03F 7/70616; G03F 7/70625; G03F 7/70633; G03F 7/70641; G03F 9/7023; G03F 9/7046; G03F 9/7073; G03F 9/7076; G03F 9/708; H01L 23/544
USPC ............... 356/124, 399–401, 625, 635, 636; 250/548; 382/141, 145, 151; 257/797; 438/5, 7, 14, 16, 401; 355/53, 55, 77
See application file for complete search history.

(56) References Cited

U.S. PATENT DOCUMENTS

| | | | |
|---|---|---|---|
| 6,803,668 B2* | 10/2004 | Holloway | H01L 23/544 257/797 |
| 7,193,715 B2* | 3/2007 | Smedt | G01N 21/4788 257/797 |
| 7,427,774 B1 | 9/2008 | Mantz et al. | |
| 7,435,512 B2* | 10/2008 | Chang | G03F 1/36 430/5 |
| 7,989,303 B2* | 8/2011 | Van Haren | G03F 9/7049 257/E23.179 |
| 8,243,273 B2 | 8/2012 | Levinski et al. | |
| 2002/0158193 A1* | 10/2002 | Sezginer | G03F 7/70633 250/237 G |
| 2003/0127751 A1* | 7/2003 | Yamada | H01L 23/544 257/797 |
| 2004/0114143 A1* | 6/2004 | Van Haren | G03F 9/7046 356/401 |
| 2004/0233439 A1* | 11/2004 | Mieher | G01N 21/956 356/401 |
| 2005/0105092 A1* | 5/2005 | Ausschnitt | G03F 7/70633 356/401 |
| 2005/0173634 A1 | 8/2005 | Wong et al. | |
| 2005/0285283 A1* | 12/2005 | Huggins | H01L 21/3212 257/797 |
| 2005/0286052 A1* | 12/2005 | Huggins | G03F 9/7076 356/401 |
| 2007/0048629 A1* | 3/2007 | Marokkey | G03F 7/70566 430/5 |
| 2008/0002213 A1* | 1/2008 | Weiss | G03F 9/7076 356/620 |
| 2008/0037134 A1* | 2/2008 | Boef | G01N 21/4788 359/648 |
| 2008/0311344 A1* | 12/2008 | Marie Kiers | G01N 21/4788 428/138 |
| 2009/0002706 A1* | 1/2009 | Weiss | G03F 9/7076 356/369 |
| 2009/0153861 A1* | 6/2009 | Musa | G03F 9/7076 356/401 |
| 2009/0303482 A1 | 12/2009 | Levinski et al. | |
| 2010/0005442 A1* | 1/2010 | Ghinovker | G03F 7/70633 716/55 |
| 2010/0140816 A1* | 6/2010 | Van Haren | G03F 7/70633 257/797 |
| 2012/0033215 A1 | 2/2012 | Kandel et al. | |
| 2013/0242305 A1* | 9/2013 | Cohen | G03F 7/70633 356/400 |
| 2013/0252429 A1* | 9/2013 | Okamoto | G03F 1/42 438/696 |
| 2013/0293890 A1* | 11/2013 | Amir | G01B 11/14 356/401 |
| 2014/0065736 A1 | 3/2014 | Amir et al. | |
| 2014/0240705 A1* | 8/2014 | Takimoto | G03F 9/00 356/401 |
| 2014/0264631 A1* | 9/2014 | Wei | H01L 21/76224 257/401 |
| 2014/0351771 A1* | 11/2014 | Amir | G03F 7/70633 716/50 |
| 2015/0153268 A1* | 6/2015 | Amir | G01N 21/9501 428/167 |
| 2015/0177135 A1* | 6/2015 | Amit | G01N 21/47 702/150 |
| 2015/0204664 A1* | 7/2015 | Bringoltz | G01B 11/272 356/492 |
| 2015/0227675 A1* | 8/2015 | Amir | H01L 22/30 716/52 |
| 2015/0242558 A1* | 8/2015 | Amit | G03F 7/0002 428/195.1 |
| 2016/0178351 A1* | 6/2016 | Amit | G01N 21/9501 356/243.1 |

* cited by examiner

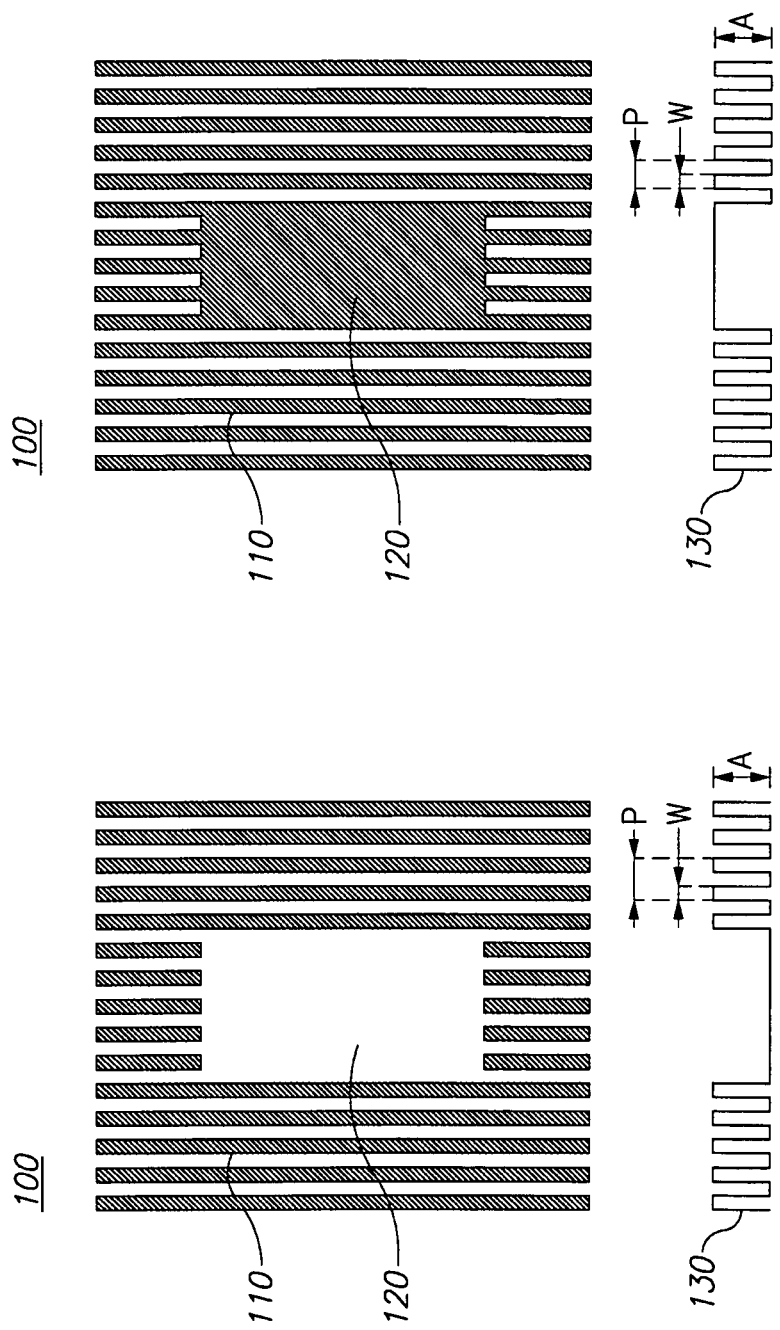

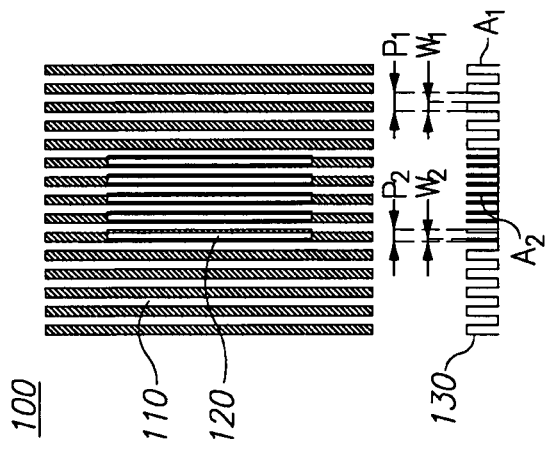
Figure 3A
Figure 3B
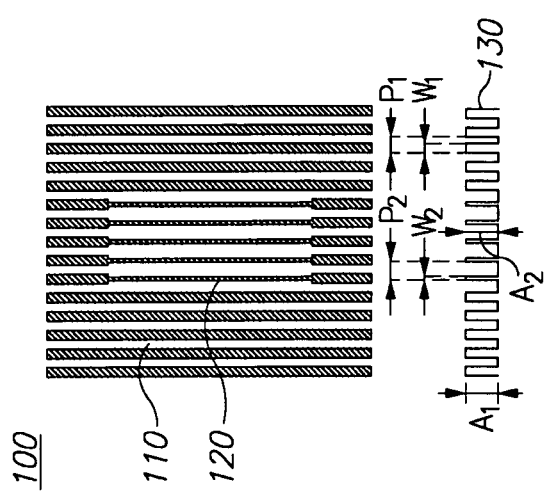
Figure 3C
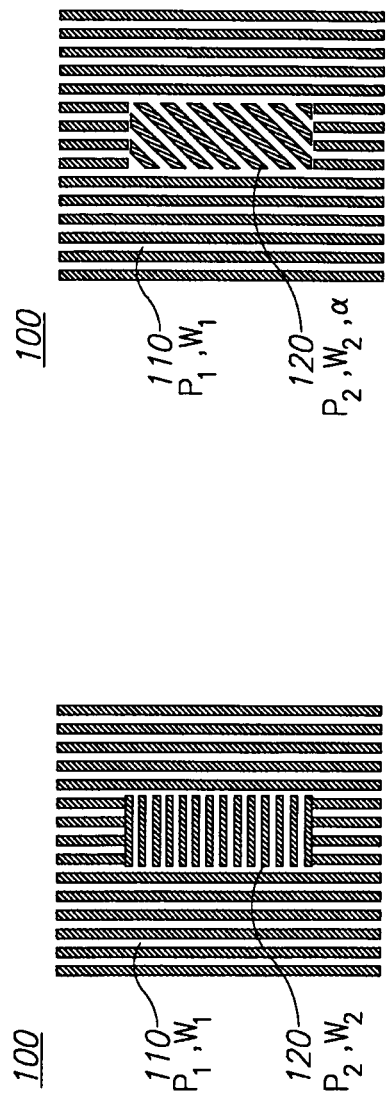
Figure 3D

PROCESS COMPATIBLE SEGMENTED TARGETS AND DESIGN METHODS

CROSS-REFERENCE TO RELATED APPLICATIONS

The present application is the U.S. national stage application pursuant to 35 U.S.C. § 371 of International Application No. PCT/US2013/71156, filed Nov. 21, 2013, which application claims benefit of U.S. Provisional Patent Application 61/729,282, filed Nov. 21, 2012.

FIELD OF THE INVENTION

The present invention relates to the field of metrology, and more particularly, to metrology target design.

BACKGROUND OF THE INVENTION

FIGS. 1A-1C schematically illustrate metrology target elements used in the prior art. FIG. 1A schematically illustrates a solid bar as target element 120 on a blank background 110 as part of designed target 100. The bar has feature width W. FIGS. 1B and 1C schematically illustrates a segmented bar as target element 120 on blank background 110 as part of designed target 100. The bar has feature width W and a segmentation pitch P. Lines 130 denotes central cross sections of target element 120 and background 110 in the respective direction which denote feature widths W and pitch P.

SUMMARY OF THE INVENTION

The present invention broadly provides a method of designing metrology targets comprising distinguishing a target element from its background area by segmenting the background area and optionally segmenting the target elements. In certain aspects, metrology targets are presented, in which all transitions between target features and adjacent background features maintain a feature size of the features below a certain threshold.

The present invention further provides a metrology target comprising at least one target element on a segmented background.

The present invention further provides a metrology target in which all transitions between target features and adjacent background features maintain a feature size of the features below 300 nm or below 100 nm.

These and other objects and advantages of the present invention will be readily appreciable from the following description of preferred embodiments of the invention and from the accompanying drawings and claims; possibly inferable from the detailed description; and/or learnable by practice of the present invention.

BRIEF DESCRIPTION OF THE DRAWINGS

The nature and mode of operation of the present invention will now be more fully described in the following detailed description of the invention taken with the accompanying drawing figures, in which:

FIG. 2A is a high level schematic illustration of a target element on a segmented background as part of a designed target, according to an embodiment of the invention;

FIG. 2B is a high level schematic illustration of a target element on a segmented background as part of a designed target, according to an embodiment of the invention;

FIG. 3A is a high level schematic illustration of segmented target elements on segmented backgrounds as part of a designed target, according to an embodiment of the invention;

FIG. 3B is a high level schematic illustration of segmented target elements on segmented backgrounds as part of a designed target, according to an embodiment of the invention;

FIG. 3C is a high level schematic illustration of segmented target elements on segmented backgrounds as part of a designed target, according to an embodiment of the invention;

FIG. 3D is a high level schematic illustration of segmented target elements on segmented backgrounds as part of a designed target, according to an embodiment of the invention;

DETAILED DESCRIPTION OF THE INVENTION

Figure 1A:
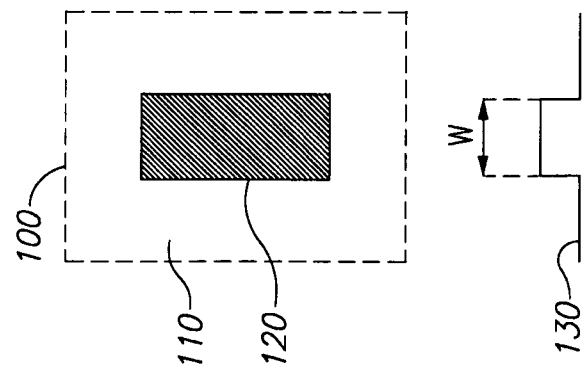
FIG. 1A schematically illustrates metrology target elements used in the prior art.

At the outset, it should be appreciated that like drawing numbers on different drawing views identify identical, or functionally similar, structural elements of the invention. It also should be appreciated that figure proportions and angles are not always to scale in order to clearly portray the attributes of the present invention.

While the present invention is described with respect to what is presently considered to be the preferred aspects, it is to be understood that the invention as claimed is not limited to the disclosed aspects. The present invention is intended to cover various modifications and equivalent arrangements included within the spirit and scope of the appended claims. In this regard, no attempt is made to show structural details of the invention in more detail than is necessary for a fundamental understanding of the invention, the description taken with the drawings making apparent to those skilled in the art how the several forms of the invention may be embodied in practice.

Furthermore, it is understood that this invention is not limited to the particular methodology, materials and modifications described and, as such, may, of course, vary. It is also understood that the terminology used herein is for the purpose of describing particular aspects only, and is not intended to limit the scope of the present invention, which is limited only by the appended claims.

Although any methods, devices or materials similar or equivalent to those described herein can be used in the practice or testing of the invention, the preferred methods, devices, and materials are now described. Meanings of technical and scientific terms used herein are to be commonly understood as by one of ordinary skill in the art to which the invention belongs, unless otherwise defined.

The terms "metrology target" or "target" as used herein in this application, are defined as any structure designed or produced or a wafer which is used for metrological purposes. Non-limiting examples for metrology targets are imaging targets such as a box in a box target and scatterometry targets such as periodic structures (e.g., gratings).

The terms "metrology measurement" or "measurement" as used herein in this application, are defined as any metrology measurement procedure used to extract information from metrology targets. For example, metrology measurements may be imaging of the targets or scatterometry measurements of the targets. Non-limiting examples for metrology measurements include overlay measurement (imaging or scatterometry), critical dimension (CD) measurement, focus and dose measurement etc.

The term "target element" as used herein in this application, is defined as any feature in the metrology target which is distinguishable in design from its background, such as individual target areas or boxes, grating bars etc.

The term "background" as used herein in this application, is defined as a wafer area proximate to a target element, which is distinguishable from the target element by design.

The term "designed target" as used in this application refers to a design principle applicable to target elements, whatever the overall target design is. The disclosed design principles rely solely on the assumption that the target elements are by design distinguishable from the background and are applicable thus to any specific target design.

Figure 1B:
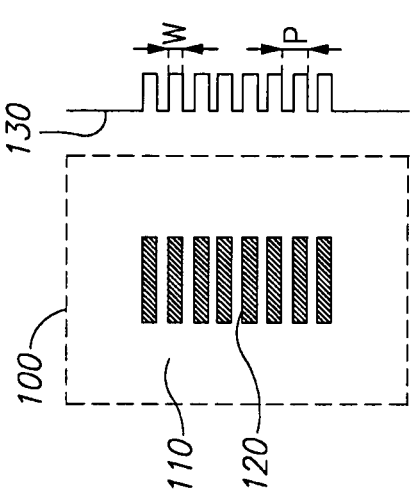
FIG. 1B schematically illustrates metrology target elements used in the prior art.

The term "segmentation" as used in this application refers to a sub-division of a target element into smaller features, typically from a scale of several hundred nanometers (e.g., 200-800 nm) in width for the solid bars illustrated in FIG. 1A to the scale of several tens of nanometers (e.g., 10-100 nm) in width for the smaller features illustrated, e.g., in FIGS. 1A and 1B.

Respectively, the term "segment" as used in this application refers to the smallest solid part or feature into which a target element or the background is segmented.

The term "feature size" as used in this application refers to a dimension of the narrow side of the smallest feature or segment in a target design. The term "feature size" implicitly includes a certain tolerance in the dimension of the narrow side of the smallest feature or segment which spans about a half of an order of magnitude in feature size. For example, features sizes of 30 nm, 50 nm and 80 nm are substantially the same feature size, and features sizes of 400 nm, 600 nm and 800 nm are substantially the same feature size, yet these two groups of feature sizes are distinct from each other.

Before at least one embodiment of the invention is explained in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

Methods of designing metrology targets are provided, which comprise distinguishing target elements from their background area by segmenting the background area and optionally segmenting the target elements. The provided metrology targets may maintain a required feature size when measured yet be finely segmented to achieve process and design rules compatibility which results in higher accuracy of the metrology measurements. Particularly, all transitions between target features and adjacent background features may be designed to maintain a feature size of the features below a certain threshold. In certain embodiments, target features and adjacent background features may be rastered, segmented, comprise device elements or be designed to simulate device elements, while maintaining or enhancing optical differentiation between the target elements and their background.

FIGS. 2A and 2B are high level schematic illustrations of target element 120 on segmented background 110 as part of designed target 100, according to some embodiments of the invention. With respect to designed target 100, it is noted that the present disclosure illustrates design principles for distinguishing target elements 120 in target 100 from their background 110, and these design principles are not to be understood as setting any limitation on the overall target design. Lines 130 denote central cross sections of target element 120 and background 110 in the respective direction. Background feature (segment) width is denoted by W, the background segmentation pitch is denoted by P and segment height (or amplitude) is denoted by A. Feature width and feature height are parameters of the feature size. In certain embodiments, any one of parameters W, P and A may be adjusted to provide contrast and reduce production errors of target elements 120 and of background 110. With respect to all target illustrations in the present disclosure it is noted that the rastering of target elements and their backgrounds in the Figures is generally used to denote solid segments. Still, as described below, target features may also be rastered in production.

FIGS. 3A-3E are high level schematic illustrations of segmented target elements 120 on segmented backgrounds 110 as part of designed target 100, according to some embodiments of the invention. Lines 130 denote central cross sections of target element 120 and background 110 in the respective direction. Feature width is denoted by $W_1$ for background segmentation and by $W_2$ for target element segmentation, the segmentation pitch is denoted by $P_1$ for background segmentation and by $P_2$ for target element segmentation, and the height (amplitude) of the segments is denoted by $A_1$ for background segmentation and by $A_2$ for target element segmentation. Differences in segment parameters W, P, A between target element 120 and background 110 may differ between layers of target 100, i.e., any of parameters $W_1$, $P_1$, $A_1$, $W_2$, $P_2$, $A_2$, may have a different value in different layers target 100.

In certain embodiments, segment heights $A_1$, $A_2$ may be controlled by process parameters and/or by process effects with respect to the width and pitch of the segments. While the Figures illustrate segmentation with $A_1=A_2$, it is underlined that certain embodiments may comprise a segmentation with $A_1 \neq A_2$. For example, a region with a larger pitch may be etched to yield shorter segments than segments in a region of a smaller pitch due to process effects. In such examples, segment height may be designed to differ between target element 120 and background 110 after certain stages such as etching and not after other stages such as illuminating the resist (latent image). In one non-limiting example, target 100 may be designed to have $A_1 \neq A_2$ in a previous layer (after etching) and $A_1=A_2$ in a current layer (before etching).

FIG. 3A is a schematic illustration of target element 120 segmented with a different feature width $W_2$ than feature width $W_1$ of background 110, according to some embodiments of the invention. In the illustrated example, target element 120 and background 110 may be segmented with the same pitch $P_1=P_2$. The difference in feature width yields a distinguishable difference between target element 120 and background 110 upon applying the respective metrology procedure (e.g., imaging or scatterometry). For example, the differing feature widths may yield a better contrast between the measured target element and the measured background.

Put differently, the different feature width may be understood as a different aspect ratio of the segments, between target element 120 and background 110. The different aspect ratio likewise distinguishes target element 120 from background 110 upon measurement. In another formulation, the different feature width may be understood as a different duty cycle (segment/space ratio) between target element 120 and background 110. The different duty cycle likewise distinguishes target element 120 from background 110 upon measurement.

FIG. 3B is a schematic illustration of target element 120 segmented with a different feature width $W_2$ than feature width $W_1$ of background 110, as well as with a different pitch $P_2$ than pitch $P_1$ of background 110, according to some embodiments of the invention. The difference in feature width and pitch yields a distinguishable difference between target element 120 and background 110 upon applying the respective metrology procedure (e.g., imaging or scatterometry). For example, the differing feature widths and pitches may yield a better contrast between the measured target element and the measured background.

In certain embodiments, feature width $W_2$ and/or pitch $P_2$ of target element 120 may be larger or smaller than feature width $W_1$ and/or pitch $P_1$ of background 110. Feature width $W_2$ and/or pitch $P_2$ of target element 120 and feature width $W_1$ and/or pitch $P_1$ of background 110 may be optimized to yield an optimal metrology performance and/or accuracy under specified metrology measurements. In a non-limiting example, these parameters of target 120 and background 110 may be designed to maximize a contrast between the target and its background in imaging metrology measurements. In certain embodiments, feature width $W_2$ and/or pitch $P_2$ of target element 120 and feature width $W_1$ and/or pitch $P_1$ of background 110 may be optimized to yield an optimal scatterometry overlay measurement and/or measurement accuracy.

FIGS. 3C and 3D are schematic illustrations of target element 120 segmented in a different orientation than background 110, according to some embodiments of the invention. The difference in segmentation orientation yields a distinguishable difference between target element 120 and background 110 upon applying the respective metrology procedure (e.g., imaging or scatterometry). For example, the different orientation may yield a better contrast between the measured target element and the measured background. In certain embodiments, the feature widths ($W_2$, $W_1$) and/or the pitches ($P_2$, $P_1$) of target element 120 and background 110 may differ or be the same. The feature widths ($W_2$, $W_1$) and/or the pitches ($P_2$, $P_1$) of target element 120 and background 110 may be optimized to yield an optimal metrology performance under specified metrology measurements. Additionally, angle α between the segment orientation of target element 120 and background 110 may be selected and adjusted, optimized to yield an optimal metrology performance and/or accuracy under specified metrology measurements.

Figure 3E:
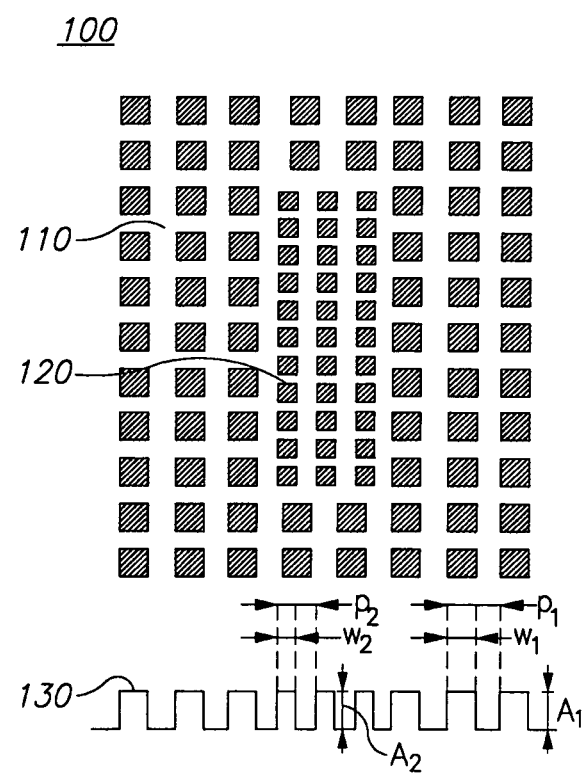
FIG. 3E is a high level schematic illustration of segmented target elements on segmented backgrounds as part of a designed target, according to an embodiment of the invention; and, FIG. 4 is a high level flowchart illustrating a method of designing metrology targets, according to some embodiments of the invention.

FIG. 3E is a schematic illustration of target element 120 and background 110 segmented in two directions, according to some embodiments of the invention. In the illustrated non-limiting example, target element 120 and background 110 are segmented with the feature widths ($W_2$, $W_1$, respectively) and pitches ($P_2$, $P_1$, respectively) same in both directions and differing between target element 120 and background 110. Clearly any other combination of these parameters (feature width and pitch, as well as angle, in each direction of each of target element 120 and background 110) is conceivable and may be optimized to improve metrology performance and/or accuracy under specified metrology measurements (e.g., to yield a distinguishable difference between target element 120 and background 110 upon applying the respective metrology procedure).

In certain embodiments, either or both target element(s) 120 and background 110 may be rastered at a specified pattern, selected to enhance their distinguishability and contrast and/or to simulate device design. In certain embodiments, target element 120 and/or background 110 may be rastered to be filled with L-shaped features or with typical device design elements (e.g., memory cell elements). Target element 120 and/or background 110 may be rastered in different patterns, which yield an optical distinction between target element 120 and/or background 110. In such embodiments, the rastering of the segments in FIGS. 2A, 2B and 3A-3E is to be understood as signifying a real rastering of the segments with specified (possibly varying) elements. In certain embodiments, target element 120 and/or background 110 may comprise device features, i.e., elements which are part of actual device designs or simulate parts of actual device designs.

In certain embodiments, target 100's design principles, i.e., the segmentation of target element(s) 120 and background 110, is configured to reduce any of: unwanted global etch bias, local etch bias, polish bias, thin film thickness bias and/or lithographic print bias below a specified threshold, depending on production and metrology requirements. Advantageously, such targets, as compared with prior art targets, are more process compatible with semiconductor manufacturing design rules and these targets enable overlay and other metrology targets for semiconductor lithographic applications to achieve better or full process compatibility. Targets 100 may be designed to be compatible with any one of the steps in the lithographic process flow, e.g., with etching, polishing and thin film deposition processes. Advantageously, the disclosed design principles also improve the ADI (after-develop inspection) to AEI (after-etch-inspection) matching of the targets.

In particular, the proposed segmentation overcomes the current problem of: (i) mismatch between the target's feature edge response related to scanner aberrations and the device response to those scanner aberrations; (ii) the semi nested nature of target edges in current designs (nested on one direction and isolated on the other direction) vs. the typically nested nature of the devices produced on the wafer; (iii) an ADI (before etch) to AEI (After etch) mismatch due to the etch bias which depends on the local resist density and is hence influenced by the typical feature size of the etched structure; (iv) dishing within the target feature or around it, due to chemical mechanical polishing; (v) subsequent parasitic capacitance in the device due to design rule violation in the target.

Figure 1C:
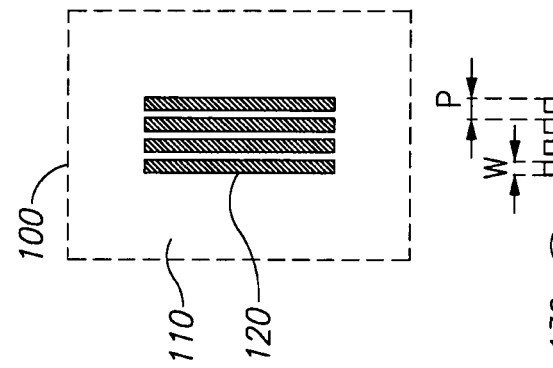
FIG. 1C schematically illustrates metrology target elements used in the prior art.

In each of the prior art design principles which were illustrated in FIGS. 1A-1C, there were feature edges which separate two non-segmented regions (one full and one blank) or a segmented region from a non-segmented region (either full or blank). Such edges result in processing effects (e.g., etch bias, dishing) which are different between metrology targets and actual devices (which typically do not exhibit such edges). This difference results in an inaccuracy in the metrology measurements. According to the presented design principles, the edges between target elements 120 and background 110 do not exhibit such transitions between non-segmented regions or between a non-segmented region and a segmented region, and hence avoid the associates processing effects and measurement inaccuracy.

It is noted, the metrology targets are designed to have a feature size of hundreds of nm (e.g., 0.2-2.5µ) in order to achieve optical requirement and adequate accuracy. However, the inventor has discovered that segmenting the target and the background differently maintains the compliance of the targets with optical requirements yet enhances the measurement accuracy due to process compatibility. Without being bound by theory, it is assumed that the small feature size resulting from segmentation causes optical effects which are beyond the resolution of the optical system and thus does not interfere with optical measurements of the target elements (being segment aggregations in the disclosed designs instead of prior art bulk features).

In certain embodiments, a metrology target is designed to have all transitions between target features and adjacent background features maintain a feature size of the features below 500 nm, below 300 nm, below 200 nm, below 100 nm or below 80 nm. Target design may be configured to enable the optical requirements for target detection and enhance the quality of the metrology measurements (e.g., enhance resolution and accuracy).

Figure 4:
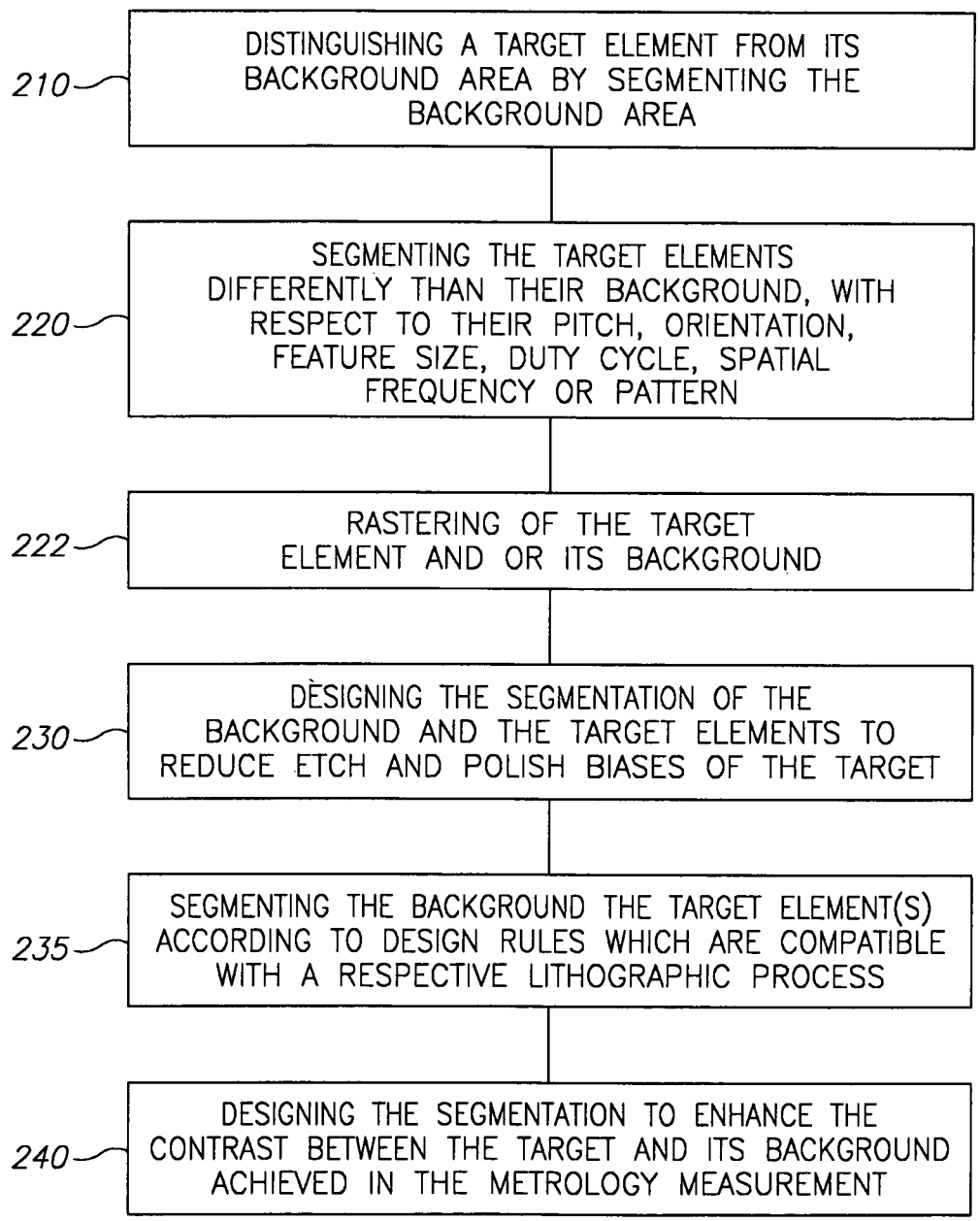

FIG. 4 is a high level flowchart illustrating method 200 of designing metrology targets, according to some embodiments of the invention. Method 200 may comprise distinguishing a target element from its background area by segmenting the background area (stage 210).

Method 200 may further comprise any of the following stages: segmenting the target element differently than its background (stage 220), for example segmenting the target element with a different pitch, a different orientation, a different feature size, a different duty cycle, a different spatial frequency and/or a different pattern than its background.

In certain embodiments, method 200 further comprises rastering at least one of the target element and its background (stage 222), in non-limiting examples—rastering the target element and its background differently and/or rastering the target element and/or its background using device design elements or features that simulate device elements or features.

In certain embodiments, method 200 further comprises designing the segmentation of the background and/or of the target elements to reduce an unwanted global etch bias, local etch bias, polish bias, thin film thickness bias and/or lithographic print bias of the target (stage 230). In particular, this may be carried out by configuring correctly the spaces and pitches between target features and background features, and among each of the target features and the background features. In certain embodiments, method 200 further comprises segmenting the background the target element(s) according to design rules which are compatible with a respective one or more lithographic process (e.g., etch, polish, thin film deposition processes) (stage 235) and/or designing the segmentation to enhance the contrast between the target and its background achieved in the metrology measurement and/or improving target accuracy (stage 240).

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their used in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Thus, it is seen that the objects of the present invention are efficiently obtained, although modifications and changes to the invention should be readily apparent to those having ordinary skill in the art, which modifications are intended to be within the spirit and scope of the invention as claimed. It also is understood that the foregoing description is illustrative of the present invention and should not be considered as limiting. Therefore, other embodiments of the present invention are possible without departing from the spirit and scope of the present invention.

What is claimed is:

1. A method of forming a metrology target comprising:
forming a target element and a background area of the metrology target, wherein the target element has a segmentation and the background area has a segmentation, wherein a feature size of the segmentation of the target element is different from the segmentation of the background area to provide contrast between the target element and the background area, wherein the target element is located within a vacant portion of the background area, wherein a feature shape and a pitch of the segmentation of the target element are the same as a feature shape and a pitch of the segmentation of the background area, wherein the segmentation of the target element is parallel to the segmentation of the background area.

2. The method of claim 1, wherein the target element is segmented with a different duty cycle than the background area.

3. The method of claim 1, wherein the target element is segmented with a different feature width than the background area.

4. The method of claim 1, wherein the target element is segmented with a different topography than the background area.

5. The method of claim 1, wherein the segmentation of the target element is thinner than the segmentation of the background area.

6. The method of claim 1, wherein the metrology target is process compatible.

7. A metrology target comprising:
a target element; and
a background area, wherein the target element has a segmentation and the background area has a segmentation, wherein a feature size of the segmentation of the target element is different from the segmentation of the background area to provide contrast between the target element and the background area, wherein the target element is located within a vacant portion of the background area, wherein a feature shape and a pitch of the segmentation of the target element are the same as a feature shape and a pitch of the segmentation of the background area, wherein the segmentation of the target element is parallel to the segmentation of the background area.

8. The metrology target of claim 7, wherein at least one of the feature width, topography, duty cycle or segmentation pattern of the segmentation of the target element is different from the segmentation of the background area.

9. The metrology target of claim 7, wherein the segmentation of the target element and the segmentation of the background area are configured to reduce at least one of: an unwanted global etch bias, a local etch bias, a polish bias, a film thickness bias or a lithographic print bias below a specified threshold.

10. The metrology target of claim 7, wherein the target element and the background area are produced using design rules which are compatible with at least one of a lithographic process, an etch process, a polish process or a thin film deposition process.

11. The metrology target of claim 7, wherein at least one of the target element or the background area is rastered.

12. The metrology target of claim 7, wherein at least one of the target element or the background area comprise one or more device features.

13. The metrology target of claim 7, wherein one or more transitions between one or more target features and adjacent one or more background area features maintain a feature size below 300 nm or below 100 nm.

14. A method of forming a metrology target comprising:
forming a target element and a background area of the metrology target, wherein the target element has a segmentation and the background area has a segmentation, wherein a feature size of the segmentation of the target element is different from the segmentation of the background area to provide contrast between the target element and the background area, wherein the target element is located within a vacant portion of the background area, wherein the segmentation of the target element is obliquely oriented to the segmentation of the background area.

15. A metrology target comprising:
a target element; and
a background area, wherein the target element has a segmentation and the background area has a segmentation, wherein a feature size of the segmentation of the target element is different from the segmentation of the background area to provide contrast between the target element and the background area, wherein the target element is located within a vacant portion of the background area, wherein the segmentation of the target element is obliquely oriented to the segmentation of the background area.

* * * * *